(12) United States Patent
Miller et al.

(10) Patent No.: US 8,545,636 B2
(45) Date of Patent: Oct. 1, 2013

(54) CONDUCTIVITY CONTROL OF WATER CONTENT IN SOLVENT STRIP BATHS

(75) Inventors: Greg P. Miller, Colorado Springs, CO (US); Michael R. Johnson, Colorado Springs, CO (US); John J. O'Connor, Antioch, IL (US); Martin Joseph, Wheaton, IL (US)

(73) Assignee: Atmel Corporation, San Jose, CA (US)

( * ) Notice: Subject to any disclaimer, the term of this patent is extended or adjusted under 35 U.S.C. 154(b) by 508 days.

(21) Appl. No.: 11/765,922

(22) Filed: Jun. 20, 2007

(65) Prior Publication Data

US 2008/0023045 A1    Jan. 31, 2008

Related U.S. Application Data

(60) Provisional application No. 60/820,506, filed on Jul. 27, 2006.

(51) Int. Cl.
*B08B 3/08*    (2006.01)
*B08B 7/04*    (2006.01)

(52) U.S. Cl.
USPC ............................... 134/18; 134/10; 134/25.4

(58) Field of Classification Search
USPC .......................................... 134/18, 27; 137/5
See application file for complete search history.

(56) References Cited

U.S. PATENT DOCUMENTS

| | | | |
|---|---|---|---|
| 4,374,681 A | 2/1983 | Schueneman | |
| 5,522,660 A | 6/1996 | O'Dougherty et al. | |
| 5,578,273 A * | 11/1996 | Hanson et al. | 422/110 |
| 5,670,376 A * | 9/1997 | Obeng | 436/55 |
| 5,924,794 A | 7/1999 | O'Dougherty et al. | |
| 6,392,417 B1 | 5/2002 | Knotter et al. | |
| 6,551,422 B1 | 4/2003 | O'Connor | |
| 6,767,877 B2 | 7/2004 | Kuo et al. | |
| 7,018,482 B1 * | 3/2006 | Geomini | 134/18 |
| 2002/0066470 A1 * | 6/2002 | Farr et al. | 134/10 |
| 2002/0197869 A1 * | 12/2002 | Nakagawa et al. | 438/689 |
| 2003/0095472 A1 * | 5/2003 | Fukui | 366/152.1 |
| 2003/0121799 A1 * | 7/2003 | Stevens et al. | 205/775 |
| 2005/0273293 A1 * | 12/2005 | Howe | 702/140 |
| 2006/0057299 A1 * | 3/2006 | Miller et al. | 427/435 |

* cited by examiner

*Primary Examiner* — Michael Kornakov
*Assistant Examiner* — Natasha Campbell
(74) *Attorney, Agent, or Firm* — Fish & Richardson P.C.

(57) ABSTRACT

A system and method for control of water content in a strip bath. The method to control water content in a solvent bath used for cleaning of semiconductor parts in the back end of semiconductor manufacturing requires addition of water to replace evaporated water. This is done by periodically adjusting a conductivity setpoint at least in part based on the elapsed chemical bathlife and at least in part based on the number of semiconductor parts that have been processed in the bath. The conductivity of the strip bath solution is then continuously measured (as by using an electrodeless conductivity probe). Water is added (as by a DI water injection system) into the bath solution whenever the solvent conductivity falls below the conductivity set point.

18 Claims, 3 Drawing Sheets

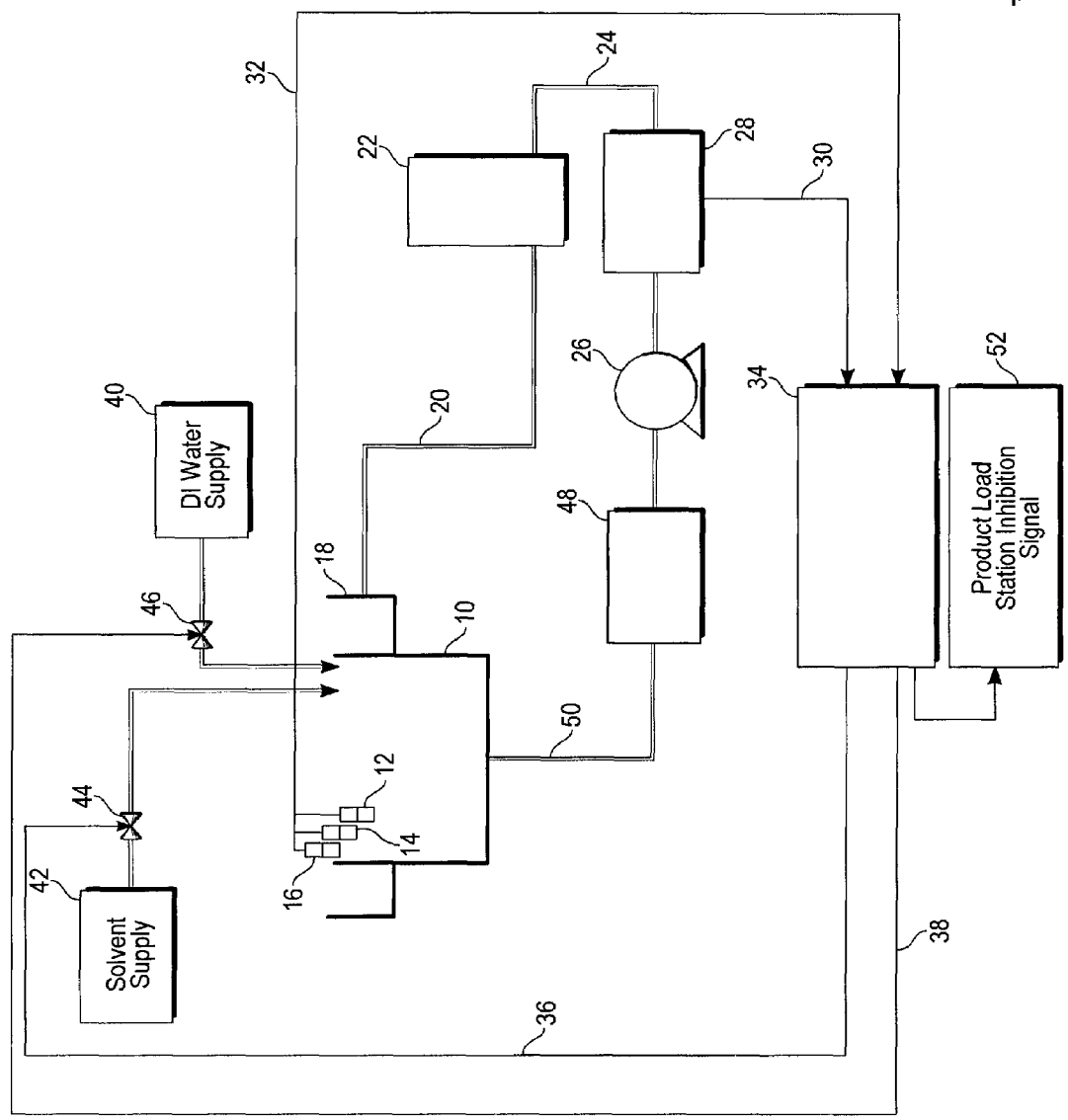

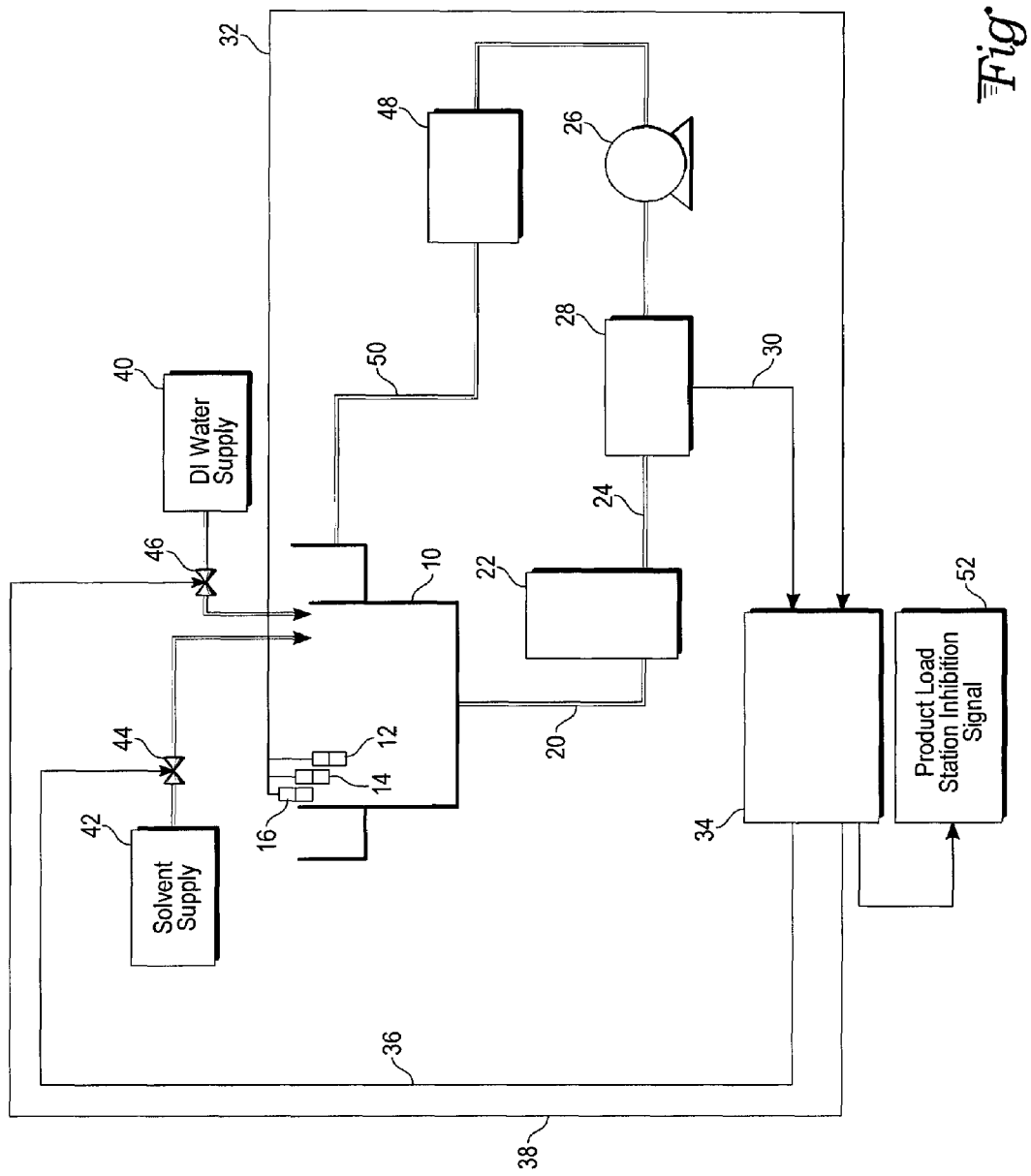
Fig. _ 2

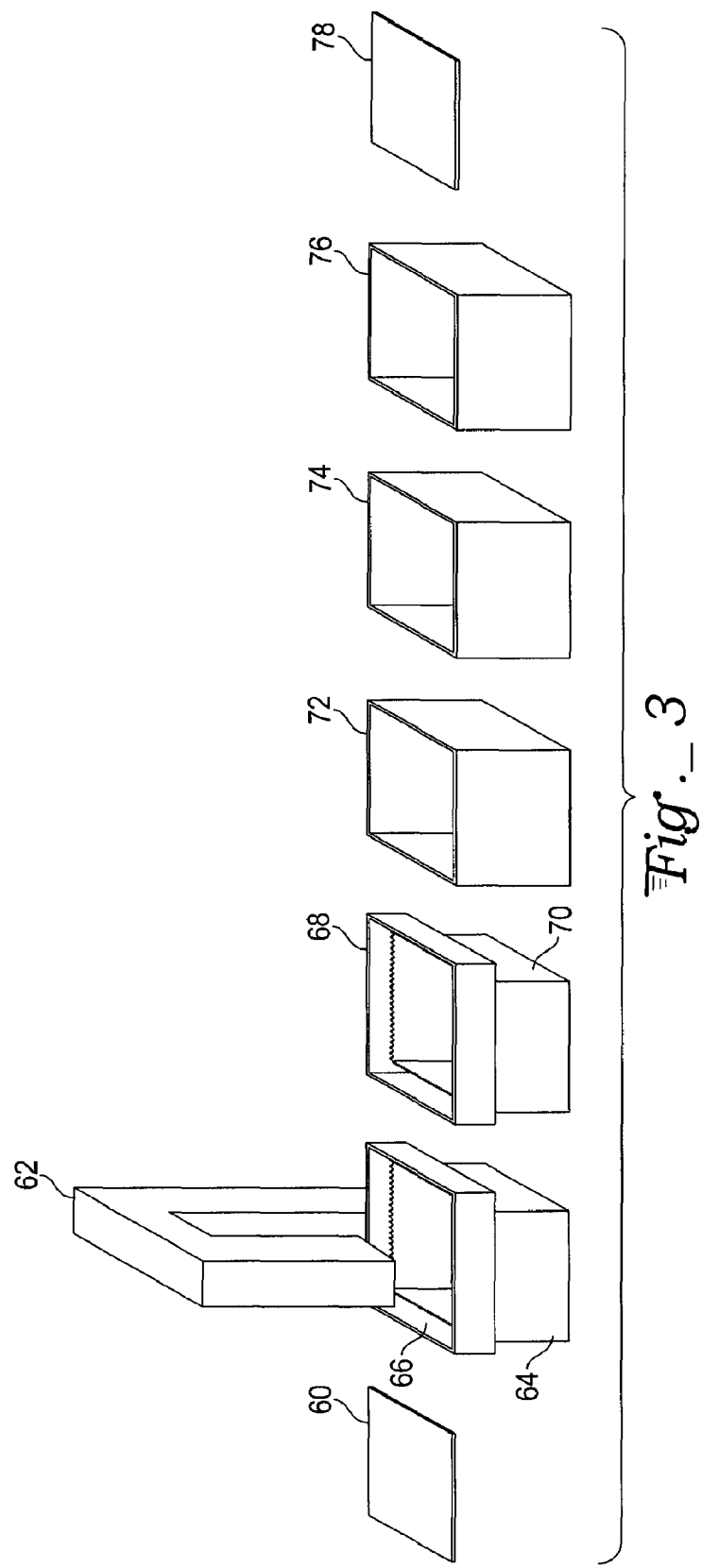
Fig._3

CONDUCTIVITY CONTROL OF WATER CONTENT IN SOLVENT STRIP BATHS

CROSS-REFERENCE TO RELATED APPLICATION

This application claims priority from U.S. provisional application No. 60/820,506, filed Jul. 27, 2006.

TECHNICAL FIELD

The present invention relates to semiconductor manufacturing and more specifically to the regulation of solvent component concentration in the back end of semiconductor processing.

BACKGROUND ART

Currently in the back end of semiconductor processing, a solvent bath is used to treat and clean surfaces. In this part of the processing, the semiconductor wafer has metal layers. "Backend" refers to the portion of semiconductor manufacturing after interconnect metal layers are deposited in the processing flow.

A number of references detail systems for use in semiconductor processing baths. Some of these systems use conductivity as a parameter for system function. For example, U.S. Pat. No. 6,392,417 discloses a system and method for determining the end of life of a chemical bath. A chemical species is added at determined time intervals. A parameter of the chemical bath, such as conductivity or pH, is measured. This is compared to a predicted value at a specific time in the bath life cycle. The end of the life of the bath is determined by the difference between the predicted value and the measured value at the time of measuring.

U.S. Pat. No. 6,767,877 discloses a silicon wafer manufacturing process that includes processing a wafer in a process tank. Hot and cold deionized ("DI") water may be supplied to the process tank at a specified supply rate to be mixed with a supplied chemical. A conductivity sensor determines the conductivity of the mixture before the mixture is added to the process tank.

U.S. Pat. No. 6,551,422 discloses a more generalized device for preparing metal for painters that includes multiple bath stages. Several baths include a conductivity sensor and some also include a pH sensor. This system is described as a system to wash and condition metal prior to painting.

Current practice is to fill a strip bath with the required solvent, allow the bath to be used in a process to clean semiconductor surfaces, and periodically top off the solvent in the bath. For example, a bath may be topped off every three hours of bathlife. The "top-off" solution is used to replace solvent compounds that have volatilized. This replaces both water that has evaporated and solvent components that readily volatize at the bath temperature. Although the top-off solution is primarily water, it is nonetheless very expensive.

The solvent composition changes over the lifetime of the bath. The solvent tends to deplete in the more readily volatized components until such components are replenished. This creates non-uniformity in the process conditions.

One possible solution that has been evaluated is to periodically make a titration unit measurement on the solvent bath throughout the solvent bath life. For example, a titration measurement may be run every hour. The resulting measurement would then be used to determine how much water to add to the solvent bath. The capability of this type of a control scenario is limited by the speed of the sample acquisition and titration equipment (sampling frequency).

It is one goal to provide a system and method in which the volatilized compounds lost during the use of a solvent bath may be readily replaced during the use of the bath. It is a further goal to obtain this using a system that is robust, provides continuous measurements, is able to detect system anomalies, and is automated.

SUMMARY

The above goals and others are achieved using a system and method for control of water content in a strip bath. The method to control water content in a solvent strip bath (generally a bath used to clean semiconductor parts) requires periodically determining a conductivity setpoint at least in part based on the chemical bathlife (e.g., hours since the last change of the solvent in the bath) and at least in part based on the number of lots or loads of semiconductor parts that have been processed in the bath. The conductivity of the strip bath solution is then continuously measured. Water is added (as by a DI water injection system) into the bath solution whenever the bath solvent conductivity falls below the conductivity setpoint.

A number of alternative embodiments, modifications, or refinements may be adopted. For example, this method could also include measuring (as by using a process sensor) the solvent level in the solvent tank and adding (e.g. injecting) a top-off solution into the strip bath if the bath solvent level falls below a set threshold. Additional sensors could be used in some embodiments to monitor overfill of the strip bath or low bath level. If either overfill or low level are detected, any injection may be terminated (e.g. water and/or top-off solvent addition could be halted) and any addition of additional semiconductor material into the strip bath can be stopped. The placement of the conductivity probe may vary. The addition of water could include the filtration of the solution into which the water is added prior to this mixture flowing into the solvent strip bath. Further in some embodiments an alarm could sound, ending addition of water and/or solvent and preventing further semiconductor material from being introduced into the bath. Such an alarm may be sounded if the measured conductivity is outside a selected range or if the total water injected over a time interval exceeds a user defined amount. A system controller may be used to control injection of top-off solvent and water, to receive signals from level sensors or the conductivity probe, and for calculation of the conductivity setpoint.

In other alternative embodiments this method could be used to control parameters, like pH, in alternative chemistries, such as acid/base solutions.

The device for effecting this method includes a solvent bath tank (e.g., a stainless steel tank), at least one liquid level sensor monitoring this tank, a solvent source, a water source, a recirculation loop, and a conductivity probe disposed such that it can monitor the conductivity of the bath solvent. The recirculation loop may include a pump guard filter, a pump, and a filter. A controller receives signals from the conductivity probe and level sensors, calculates the conductivity setpoint as described above, and sends instructions for the injection of water or top-off solution.

BRIEF DESCRIPTION OF THE DRAWINGS

FIG. 1 is a plan view of a first embodiment of the conductivity control device.

FIG. 2 is a plan view of a second embodiment of the conductivity control device.

FIG. 3 is a plan view of an embodiment for the cleaning of wafers in the back end of a semiconductor process line.

DETAILED DESCRIPTION OF THE INVENTION

The present embodiments are part of a back end semiconductor manufacturing system. For example, the solvent bath embodiments disclosed may be part of a manufacturing hood. Such a hood may include an input station, two solvent tanks, one isopropyl alcohol (IPA) rinse tank, one dionized (DI) water rinse tank, a dryer, and an output station. Each tank has its own recirculation loop if appropriate. The DI and IPA tanks do not circulate. A single robot with X and Y axis movement serves to transport the product lots from station to station, and into and out of each tank.

With reference to FIG. 1, the plan view illustrates a system for controlling the composition of a backend solvent bath for cleaning semiconductor parts. The semiconductor parts are cleaned in a first process tank 10. A weir 18 may be attached to tank 10.

The solvent level in the tank 10 is monitored by low level sensor 12, process sensor 14, and overfill sensor 16. All three of these sensors are linked by wire bundle 32 to controller 34. Low level sensor 12 acts, among other purposes, to warn of potential damage to the heaters (not shown) if the solvent level falls below the heater location in or on the tank. The overfill sensor 16 warns of potential system flooding by over fill of the tank. Both of these two sensors are safety features built into the system.

Process sensor 14 indicates a need to replenish the solvent due to volatilization of solvent constituents or chemical dragout.

Solvent in the tank may be circulated continuously through a filter to maintain low defect levels. The solvent is drawn from the bottom of tank 10 through pipe 50, through pump guard filter 48, through pump 26, and past conductivity probe 28. Conductivity probe 28 may be an electodeless conductivity probe. Alternatively, conductivity could be measured using an electrode pair.

If an electrodeless conductivity probe is used, such a probe may be a relatively low cost electrodeless conductivity device allowing the measurement of conductivity by inductive means. Since such a probe is non-contact, the system is not subject to fouled or polarized electrodes. Fouling of electrode pairs may occur if the electrodes become covered in charged particles, producing erroneous readings. Filters may mitigate against such fouling. However, electrodeless measuring of conductivity may prove more reliable. Electrodeless measuring of conductivity ensures accuracy. Accurate conductivity measurements are maintained for extended periods without cleaning or maintenance. Such probes are available from a number of manufacturers in a number of different configurations. Such a probe may include an internal temperature compensation feature to allow automatic temperature compensation during conductivity measurements. The signal from the conductivity probe is sent by wire 30 to controller 34.

The liquid pumped past conductivity probe 28 by pump 26 is pumped into pipe 24 and through second filter 22. The fluid is then pumped though pipe 20 and into weir 18. This embodiment adapts a "reverse flow" configuration in which liquid recirculates into the weir from the pump. Liquid then fills the weir to a level at which the liquid flows into the tank. The solution is drawn out of the tank from the bottom of the tank.

As noted the signal from the conductivity probe 28 is sent though wire 30 to controller 34. The controller also monitors the time elapsed in the chemical bathlife and number of lot loads processed in the bath. From one or both of these factors the controller determines a conductivity setpoint. If the measured conductivity is lower than the conductivity setpoint a signal is then sent through wire 38 to valve 46. Valve 46 controls supply of water (e.g. deionized water) from water source 40. For use herein, "water source" or "solvent source" may be either a pressurized line, a tank, or other storage device for the specified liquid or a metering device (e.g., a flow meter or dosing pump) allowing connection to a supplied container or source of the specified liquid. When valve 46 is opened, water may flow from water source 40 into tank 10, where it is combined with the solvent. This mixture then flows past filter 48 and conductivity probe 28 via pipe 50, allowing remeasurement of conductivity. A measurement closer to the conductivity setpoint will be achieved following shut off of valve 46 and recirculation of the injected water into first tank 10.

Process sensor 14 is also able to send electronic signals to the controller 34. If the process sensor 14 detects that the fluid in tank 10 is below a set threshold, a solvent replenish signal is sent through wire 36, signaling valve 44 to open. This allows solvent to flow from solvent supply source 42 into tank 10, where the solvent resupply fluid mixes with the tank solvent. The controller 34, signals valve 44 to shut after sensor 14 detects a full tank situation.

In solvent baths, the bath level may over time become lower during the backend process either because of the evaporation of water or because of the volatilization of volatile components of the solvent solution. In the illustrated system, conductivity probe 28 substantially continuously monitors the loss of water and allows automatic adjustment of water content through the bathlife cycle. In addition, the process level sensor 14 allows independent monitoring of bath level, thereby providing an indication of loss of solvent bath components other than water. This can trigger a need to supply solvent to the bath, as described.

A number of modifications and alterations of this system are possible. For example, the illustrated system has both the DI water supply 42 and the solvent supply 40 supplied directly into tank 10. In other configurations, the DI water supply and/or the solvent supply may be added into weir 18. For either the tank 10 or weir 18, the water and/or the solvent may be added into the top, side or through the bottom of the tank or the weir. Additionally, the water and/or the solvent may be added into the flow stream, as by lining solvent supply 42 and DI water supply 40 to pipe 50.

With reference to FIG. 2, a plan layout of a forward flow configuration is illustrated. In this configuration the solution in tank 10 flows into weir 18 and into pipe 50. The solution flows through pump guard filter 48 and through pump 26. Pump 26 pumps the solution past conductivity probe 28, through pipe 24, past filter 22 and back into the bottom of tank 10 through pipe 20. In this embodiment, the "forward flow" is the reverse of the configuration of FIG. 1. The solution flows into the bottom of tank 10, overflows into weir 18 and is drawn from weir 18 through the pipes by pump 26 and past conductivity probe 28. The remaining elements, including the controller 34, and the sensors 12, 14, and 16 are the same as in FIG. 1.

As initially noted, these tanks are part of the back end of a semiconductor manufacturing process. An embodiment of the hood layout is shown in FIG. 3. In this layout lots of semiconductor wafers are moved from input station 60 by transfer robot 62. Robot 62 first transfers the lot into first solvent tank 64 having weir 66. Following cleaning in this first solvent tank treatment, the robot 62 moves the batch into second solvent tank 70 having a weir 68. Following treatment in this second tank 70, the lot is moved into an isopropyl alcohol rinse tank 72, followed by a rinse in deionized water rinse tank 74. The robot next moves the lot into centripetal drier 76, where the lot is dried. Alternate driers may be used. Following drying, the lot is moved onto output station 78. The controller 34 of FIGS. 1 and 2 may also control the robot, such that if a system error is detected, no further lots are moved from the input station 60. This is indicated as the signal sent on wire 52.

Water content is controlled in a backend solvent bath solution. This bath may contain an amine based semiconductor strip solution. Control of the solvent composition may utilize an electrodeless conductivity sensor to continuously measure bath conductivity. The amine-based solution contains single or multiple amine constituents and a corrosion inhibitor, as for example, hydroxyl-amine and filler amine. Preferably the solution is held in a stainless steel tank but this system would work for other tank materials (e.g., quartz or PVDF tanks).

The sensor provides continuous feedback on the solution's conductivity. Data modeling reveals that this conductivity reading is a function of water content, the span of the chemical bath life, and the number of lot loads that have been processed in the bath. This may be modeled as:

$$C = f([H20], B, L)$$

Where:
C=conductivity
[H20]=water concentration
B=bathlife (the amount of time in hours since the last exchange of the bath solvent)
L=Lot count (the number of lot loads since the last exchange of the bath solvent)

Bathlife is important because iron (Fe) from the stainless steel tank accumulates in the solvent. The lot count is important due to the presence of metal lines on the wafers and the presence of dry-etch byproducts that must be removed by the solvent within the bath. Both of these parameters (bathlife, lot count) effect the overall bath solvent composition. Water content can, therefore, be controlled by a simple algebraic manipulation:

$$[H20] = f(C, B, L)$$

This is accomplished by conductivity setpoint adjustments based upon the amount of time and the number of lot loads since the last chem change. This conductivity reading is a function of water content. Water content may change during the span of a chemical bathlife. Further, water content in a solution may change depending on the number of lot loads that have been processed in a bath.

The conductivity setpoint is determined by the control system and is not a constant value throughout the total chemical bathlife. The setpoint is increased from the initial setpoint by two separate adjustments, which must be factored into setpoint recalculation. First, the setpoint varies with the interval since the last total exchange of the cleaning solvent. Second, the setpoint is adjusted based on the number of lot loads that have been processed in the bath.

Conductivity readings are compared against the conductivity setpoint to determine if the conductivity is within acceptable limits/range. In the embodiment of FIG. 1 water will be injected to raise the solution conductivity if the solution conductivity is lower than the setpoint conductivity. However in other embodiments water and/or top off solution is added to lower the solution conductivity.

The conductivity system provides continuous measurements that ensure the conductivity (and therefore the water concentration) is within an acceptable range, provides better concentration control than can be achieved with periodic top off of the bath using a top-off solution, and eliminates the downtime required for manual top off. Further, the system of continuous conductivity measurement is very useful in diagnosing equipment-related solvent bath problems.

Continuous monitoring of the water concentration in the solvent solution allows increased confidence that the solvent bath is production worthy. The system can signal an alarm and prevent further lot introduction if any of the conductivity probe, the overfill sensor, the process sensor, the low level sensor, or the cumulative water injection volume per rolling 60 minute period detects or indicates a system malfunction.

Such a system has a number of advantages compared to the use of a titration unit. First, the user is provided continuous and rapid feedback of both the water content and the loss of other volatile solvent components. Second, the user can perform low-risk, real-time data smoothing using repeat measurements. Third, there is no dependence on chemical sample acquisition equipment. Fourth, the user eliminates costs of the titration equipment and the titration chemicals.

DI water is delivered by the illustrated system in FIG. 1 under control of a controller 34 based upon conductivity readings, user-definable dosing volumes, and user-definable delay times. The conductivity setpoint is adjusted from the initial bath setpoint by two user-defined ramp rates. The initial setpoint is a user defined value and may be used during solvent chemical changes once a bath is exhausted.

The conductivity ramp rates may be different for the two solvent baths shown in FIG. 3 due to differences in both temperature, exhaust, and chemical drag-in/drag-out differences.

In such an instance, the two conductivity ramp rates apply to bathlife (period since the solvent chemical was last totally replaced, usually measured in hours) and the count of lots or loads added since the last chemical change.

Solvent changes, solvent replenishments, and DI water injections history is recorded in a memory (which can be part of controller 34). This allows anomalies or other atypical incidents to be accurately investigated and resolved. This greatly enhances the capacity for quality control and quality assurance.

The conductivity control and other specification limits (such as conductivity limits, maximum injection per time interval, etc.) may be defined by a user as a percentage of the conductivity setpoint or a constant offset of the conductivity setpoint. This maintains the system's ability to adjust the conductivity setpoint and adjusts the control and the specification limit values similarly. The percentage or offset approaches allow for a tighter control window than would be realized with constant control and specification limit values. If the conductivity goes out of spec. (i.e., is outside a specified threshold range) the system will trigger an alarm, stop injecting water, and prohibit any further lots from loading. This can also occur, if overfill sensor 16 or low level sensor 12 detect overfill or low level conditions. Controller 34 sends a signal on wire 52 to a product load station (not shown in FIG. 1) to stop any further loading of semiconductor material into the solvent baths. If the conductivity goes out of spec/acceptable range control for a user-definable period of time or if the total water injection over the last rolling 60 minute period exceeds a user-definable amount the system will trigger an alarm, stop injecting water and prevent further lot loading. The total water injection parameter can be overridden for a user-definable period of time after solvent chemical changes to permit slight differences in new bath conductivity values.

Initial testing with production runs was performed on multiple "top-off" bathlives in a solvent hood. These were run in the old standard fashion where the hood would be poured up with solvent solution, run for 3 hours, topped-off (using a solution of low vapor pressure constituents of the original solvent mixture—this is predominately water), running, and then topping off again every $3^{rd}$ hour. Chemical samples of this bathlife were obtained after the temperature stabilized with the initial chemistry pour, before and after each chemical top-off, and at the end of the bathlife. These samples were analyzed for water content, pH, metal level analysis (ICPMS), and concentration analysis of the other solvent constituents.

The data was empirically analyzed to generate a surface response model. The first analysis used the bathlife, lot count, and solvent constituent analysis but ignored the metals content. This explained 90% of the variation in the data and the model was statistically significant (an ANOVA revealed that "Prob>F" was <0.0001 on this model and each of the top-off models discussed below). The only important parameters were $[H_2O]$ and corrosion inhibitor concentration. The model using the metal content explained 99% of the variation in the data with only $[H_2O]$ and $[Al]$ being statistically significant parameters.

The aluminum relationship was present because of the presence of an AlCu alloy on the product wafers. Modeling the [Al] against the bathlife showed that this was a statistically significant assumption but that it only explained 60% of the variation in the data. This low 60% value is partially caused by variability in the product that is being stripped. This could be variation between product lots. Fe, Cr, and Ni also show up as parameters that trend with bathlife and provide a relationship with conductivity, these probably account for some of this low 60% explanation. These metals are accumulating in the solution because of the presence of the stainless steel process tank. All metal (Al, Fe, Cr, and Ni) contamination data had orthogonality issues since they all were accumulating over the bathlife.

Evaluating another bathlife without metals showed that the model explained 88% of the variation in the data with statistically significant parameters: Bathlife and primary amine concentration. The model could also be generated with the same results with statistically significant parameters Bathlife and $[H_2O]$. This showed that the $[H_2O]$ and primary amine concentration data was also confounded due to similarities in their vapor pressures.

The same data modeled using metal content data explained 97% of the variation in the data with only $[H_2O]$, Lot Count, Bathlife, and [Al] as statistically significant parameters (plus second order interaction terms). Dropping the interaction terms (as small contributors) and the [Al] (since it is confounded with Bathlife) leaves only $[H_2O]$ and easily monitored parameters Lot Count and Bathlife. This produced a model that explained 90% of the variation in the data. Since the incoming water content of the fresh solvent is fixed, the $[H_2O]$ term could be likewise changed to a constant. This provides the Equation 1 below:

Equation 1: Conductivity Model Results $$\text{Conductivity}=2.700+1.678E^{-3}(L)+2.808E^{-3}(H)$$

Where:
L=Lot Count through the hood
H=Hours in Bathlife since the bath was poured This model requires that the conductivity values meet a conductivity setpoint which is adjusted over the course of the whole bathlife based upon how many lots have been run through the hood (L) at any time and how many hours have elapsed since the last chem change (H). If the conductivity falls outside a specified band around this setpoint ramp the system will not permit lot addition.

The model shown above was used on the initial deionized water (DI) inject/conductivity controlled bathlife with good results.

In a single DI injection bathlife the success criteria was defined as 20+/−2% $H_2O$ across the whole bathlife. The water content was reasonably stable, although the water content was lower than desired.

The model was found to not perform as well in the actual DI injection bathlife as it did for a topped-off bathlife. This is justified since the top off has additional chemical additions (present in the top-off solution) compared to just a DI injection. It also was found that the conductivity setpoint adjustment constants needed to be different for the two baths in the hood (shown in FIG. 3). This makes sense when considering the two tanks have different exhaust performance, different temperature performance, and are seeing differences in the production material that is put into them. As lots are placed into the first tank the lots are dry and are at room temperature. When the lots go into the second tank they are wet and are warm (75° C.). The data from multiple DI inject bathlives was analyzed to provide the Equation 2 and Equation 3, below, for the $1^{st}$ and $2^{nd}$ solvent tanks.

Equation 2: Final $1^{st}$ Solvent Tank Model $$\text{Tank1 Conductivity}=2.720+2.210E^{-2}(L)+4.860E^{-3}(H)$$

Equation 3: Final $2^{nd}$ Solvent Tank Model $$\text{Tank2 Conductivity}=2.720+3.214E^{-2}(L)+3.370E^{-3}(H)$$

The user of this approach would need to first perform testing upon their specific hood due to temperature compensation, recirculation flowrate, robot drip, and exhaust differences. This data can be modeled to provide a starting point for conductivity setpoint ramp rates. This data will probably require minor modifications once true conductivity control is introduced.

What is claimed is:
1. A method for semiconductor part processing, the method comprising:
periodically adjusting, using a controller, a conductivity set point for a solvent solution in a solvent bath based on a chemical bathlife interval and a number of semiconductor parts processed in the solvent bath, wherein periodically adjusting the conductivity set point includes increasing the conductivity set point from an initial set point value;
substantially continuously measuring bath solvent conductivity to obtain measured bath solvent conductivity, wherein the bath solvent conductivity is measured while recirculating used solvent solution into the solvent bath using a recirculation loop;
injecting water into the solvent solution in the solvent bath whenever the measured bath solvent conductivity falls below the adjusted conductivity set point during processing of the semiconductor parts;
recording, by the controller and in a memory associated with the controller, a history of one or more of solvent changes, solvent replenishments and water injections into the solvent solution;
investigating anomalies and other atypical incidents based on the recorded history; and
resolving the anomalies and other atypical incidents in response to the investigation.

2. The method of claim 1, wherein substantially continuously measuring the bath solvent conductivity is effected using an electrodeless conductivity sensor.

3. The method of claim 1, further including sending from the controller an alarm signal if the measured bath solvent conductivity is outside a selected range of the adjusted conductivity set point, the alarm signal preventing further injection of water into the solvent solution and preventing additional semiconductor parts from being placed in the solvent bath.

4. The method of claim 1, further including sending from the controller an alarm signal if total water injected for a selected time interval exceeds a selected water amount, the alarm signal preventing further injection of water into the solvent solution and preventing additional semiconductor parts from being placed in the solvent bath.

5. A method comprising:
periodically adjusting, using a controller, a conductivity set point for a solvent solution in a solvent bath based on hours of bathlife and on an amount of semiconductor material processed in the solvent solution during the hours of bathlife, wherein periodically adjusting the conductivity set point includes increasing the conductivity set point from an initial set point value;
measuring solution conductivity of the solvent solution to obtain measured solution conductivity, wherein the solution conductivity of the solvent solution is measured while recirculating used solvent solution into the solvent bath using a recirculation loop based on determining that the measured solution conductivity is below the adjusted conductivity set point, adding, by the controller, water into the solvent solution by controlling a valve such that water flows from a water source into the solvent bath;
repeating measurement of the measured solution conductivity of the solvent solution with the added water while recirculating the solvent solution with the added water from the solvent bath using the recirculation loop after the addition of water into the solvent solution has been terminated;
recording, by the controller and in a memory associated with the controller, a history of one or more of solvent changes, solvent replenishments and water injections into the solvent solution;
investigating anomalies and other atypical incidents based on the recorded history; and
resolving the anomalies and other atypical incidents in response to the investigation.

6. The method of claim 5, wherein measuring solution conductivity is effected using an electrodeless conductivity sensor.

7. The method of claim 5, further including triggering an alarm signal if total water added for a selected time interval exceeds a selected water amount, the alarm signal preventing further addition of water or solvent into the solvent solution and preventing additional semiconductor materials from being placed in the solvent bath.

8. The method of claim 1, wherein injecting water into the solvent solution is effected by a signal sent from the controller, the controller being configured to open a second valve such that water flows from a water source in to the solvent bath.

9. The method of claim 1, comprising:
determining, using a first sensor, that a level of solvent solution in the solvent bath is below a pre-determined threshold;
responsive to the determining, triggering the controller to open a valve such that solvent flows from a solvent source in to the solvent bath;
detecting, using the first sensor, when the level of solvent solution in the solvent bath reaches a full tank; and
responsive to the detecting, triggering the controller to close the valve such that solvent flow from the solvent source in to the solvent bath is terminated.

10. The method of claim 9, comprising:
monitoring the level of solvent solution in the solvent bath using a second sensor; and
triggering an alarm based on the second sensor determining the level of solvent solution being below a location of a heater in the solvent bath, the alarm indicating potential damage to the heater.

11. The method of claim 9, comprising:
monitoring the level of solvent solution in the solvent bath using a third sensor; and
triggering an alarm based on the third sensor determining an overfill condition associated with the level of solvent solution, the alarm indicating potential system flooding.

12. The method of claim 2, wherein the electrodeless conductivity sensor includes an internal temperature compensation feature such that the electrodeless conductivity sensor automatically compensates for a temperature of the solvent solution when measuring the bath solvent conductivity.

13. The method of claim 5, comprising:
measuring, using a first sensor, a level of solvent solution in the solvent bath;
responsive to the first sensor measuring the level of solvent solution in the solvent bath below a selected level, triggering the controller to open a valve such that solvent flows from a solvent source in to the solvent bath;
detecting, using the first sensor, when the level of solvent solution in the solvent bath reaches a full tank; and
responsive to the detecting, triggering the controller to close the valve such that solvent flow from the solvent source in to the solvent bath is terminated.

14. The method of claim 13, comprising:
monitoring the level of solvent solution in the solvent bath using a second sensor; and
triggering an alarm based on the second sensor determining the level of solvent solution being below a location of a heater in the solvent bath, the alarm indicating potential damage to the heater.

15. The method of claim 6, wherein the electrodeless conductivity sensor includes an internal temperature compensation feature such that the electrodeless conductivity sensor automatically compensates for a temperature of the solvent solution when measuring the bath solvent conductivity.

16. The method of claim 1, wherein measuring the bath solvent conductivity comprises:
measuring the bath solvent conductivity as at least one of a percentage of the adjusted conductivity set point and a constant offset of the adjusted conductivity set point.

17. The method of claim 2, wherein recirculating the used solvent solution into the solvent bath using the recirculation loop comprises:
drawing the used solvent solution from a bottom of the solvent bath through a pipe;
moving the used solvent solution through a pump guard filter for maintaining low defect levels; and
pumping, by a pump, the filtered solvent solution past the electrodeless conductivity sensor.

18. The method of claim 6, wherein recirculating the used solvent solution from the solvent bath using the recirculation loop comprises:

drawing the used solvent solution from a bottom of the solvent bath through a pipe;
moving the used solvent solution through a pump guard filter for maintaining low defect levels; and
pumping, by a pump, the filtered solvent solution past the electrodeless conductivity sensor.

* * * * *

UNITED STATES PATENT AND TRADEMARK OFFICE
CERTIFICATE OF CORRECTION

PATENT NO.         : 8,545,636 B2
APPLICATION NO.    : 11/765922
DATED              : October 1, 2013
INVENTOR(S)        : Greg P. Miller It is certified that error appears in the above-identified patent and that said Letters Patent is hereby corrected as shown below:

In the Specification:

In Column 3 Line 12, delete "dionized" and insert --deionized--, therefor.

In Column 3 Line 39, delete "electodeless" and insert --electrodeless--, therefor.

In Column 5 Line 26, delete "C=f([H20],B,L)" and insert --C=f([$H_2O$],B,L)--, therefor.

In Column 5 Line 29, delete "[H20]" and insert --[$H_2O$]--, therefor.

In Column 5 Line 43, delete "[H20]" and insert --[$H_2O$]--, therefor.

In Column 7 Line 21, Delete "[$H_2$0]" and insert --[$H_2O$]--, therefor.

Signed and Sealed this
Seventh Day of January, 2014

Margaret A. Focarino
*Commissioner for Patents of the United States Patent and Trademark Office*